(12) United States Patent
Jansen et al.

(10) Patent No.: US 7,928,407 B2
(45) Date of Patent: Apr. 19, 2011

(54) LITHOGRAPHIC APPARATUS AND DEVICE MANUFACTURING METHOD

(75) Inventors: Hans Jansen, Eindhoven (NL); Sebastiaan Maria Johannes Cornelissen, Eindhoven (NL); Sjoerd Nicolaas Lambertus Donders, Vught (NL); Roelof Frederik De Graaf, Veldhoven (NL); Christiaan Alexander Hoogendam, Westerhoven (NL); Hernes Jacobs, Rossum ov (NL); Martinus Hendrikus Antonius Leenders, Rhoon (NL); Jeroen Johannes Sophia Maria Mertens, Duizel (NL); Bob Streefkerk, Tilburg (NL); Jan-Gerard Cornelis Van Der Toorn, Eindhoven (NL); Peter Smits, Baarlo (NL); Franciscus Johannes Joseph Janssen, Eindhoven (NL); Michel Riepen, Bergschenhoek (NL)

(73) Assignee: ASML Netherlands B.V., Veldhoven (NL)

( * ) Notice: Subject to any disclaimer, the term of this patent is extended or adjusted under 35 U.S.C. 154(b) by 942 days.

(21) Appl. No.: 11/603,228

(22) Filed: Nov. 22, 2006

(65) Prior Publication Data
US 2007/0114451 A1    May 24, 2007

Related U.S. Application Data

(63) Continuation-in-part of application No. 11/285,774, filed on Nov. 23, 2005.

(51) Int. Cl.
*G21K 5/10*    (2006.01)

(52) U.S. Cl. .................. 250/440.11; 250/492.1; 355/53
(58) Field of Classification Search ............. 250/440.11
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Phillip A Johnston
(74) *Attorney, Agent, or Firm* — Pillsbury Winthrop Shaw Pittman LLP

(57) ABSTRACT

In an immersion lithographic apparatus, bubble formation in immersion liquid is reduced or prevented by reducing a gap size or area on a substrate table and/or covering the gap.

15 Claims, 6 Drawing Sheets

U.S. PATENT DOCUMENTS

| | | | |
|---|---|---|---|
| 7,199,858 B2 * | 4/2007 | Lof et al. | 355/30 |
| 7,213,963 B2 | 5/2007 | Lof et al. | |
| 7,289,193 B1 * | 10/2007 | Subramanian et al. | 355/67 |
| 7,483,119 B2 * | 1/2009 | Owa et al. | 355/53 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0175776 A1 | 8/2005 | Streefkerk et al. | 427/256 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0225734 A1 | 10/2005 | De Smit et al. | 355/30 |
| 2005/0233081 A1 | 10/2005 | Tokita | 427/256 |
| 2006/0066826 A1 | 3/2006 | Luijten et al. | |
| 2006/0119818 A1 | 6/2006 | Nagasaka | 355/53 |
| 2006/0139593 A1 | 6/2006 | Nagasaka et al. | |
| 2006/0221315 A1 | 10/2006 | Beckers et al. | |
| 2006/0250590 A1 | 11/2006 | Streefkerk et al. | 355/53 |
| 2006/0290908 A1 | 12/2006 | De Graaf et al. | 355/53 |
| 2007/0132919 A1 | 6/2007 | Hsu et al. | |
| 2007/0132969 A1 | 6/2007 | Gellrich et al. | |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| EP | 1 429 188 A2 | 6/2004 |
| EP | 1 420 300 A3 | 8/2005 |
| EP | 1 713 113 A1 | 10/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/006418 A1 | 1/2005 |
| WO | WO 2005/010611 | 2/2005 |
| WO | WO 2005/024517 | 3/2005 |
| WO | WO 2005/074014 A1 | 8/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithoqraphy 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

Australian Written Opinion (Corrected Version) for Singapore Patent Application No. 200608170-7 dated Jul. 21, 2008.

European Search Report issued for European Patent Application No. 06255960.4—2222 dated Mar. 5, 2007.

Chinese Office Action for Chinese Application No. 200610171860.7 dated Sep. 18, 2009.

* cited by examiner

LITHOGRAPHIC APPARATUS AND DEVICE MANUFACTURING METHOD

RELATED APPLICATION

This application is a continuation-in-part of co-pending U.S. patent application Ser. No. 11/285,774 filed Nov. 23, 2005, the entire contents of which is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member which extends along at least a part of a boundary of the space between the final element of the projection system and the substrate table, as depicted in FIG. 5. The barrier member is substantially stationary relative to the projection system in the XY plane though there may be some relative movement in the Z direction (in the direction of the optical axis). A seal is formed between the barrier member and the surface of the substrate. In an embodiment, the seal is a contactless seal such as a gas seal. Such a system with a gas seal is disclosed in U.S. patent application publication no. US 2004-0207824, hereby incorporated in its entirety by reference.

In European patent application publication no. EP 1420300 and U.S. patent application publication no. US 2004-0136494, each hereby incorporated in their entirety by reference the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

One of the problems with immersion lithography is the presence of bubbles in the immersion liquid. If the path of the projection beam passes through areas of immersion liquid that contain bubbles, this may deleteriously affect the quality of the patterned imaged projected onto the substrate.

Bubbles may be present in the immersion liquid for a number of reasons. The first, for example, is that not all the gas is displaced by liquid when the immersion space is filled with liquid.

Macroscopic features may prevent capillary filling of the gap between the immersion system and the substrate within the time it takes for the substrate to pass across the immersion system. This may result in gas becoming trapped in the gap. The surface tension of the liquid pulls the trapped gas volume into a bubble, which will float once the buoyancy of the bubble exceeds the surface tension of the immersion liquid holding the gas bubble to the a surface of the gap. The presence of a gap in a wall of the immersion space may provide a trap in which a bubble of gas may remain even when the space is immersed in liquid.

Rough surfaces may also prevent the capillary filling of the gap, but on a microscopic scale. The immersion liquid contacts the projections of a rough surface, but does not fully wet the contours of the surface. The extent of the roughness of the surface is proportional to the force caused by the surface tension and so gas bubbles remain trapped more easily. As the immersion liquid layer passes over the rough surface, the "effective contact angle" or the angle at which the liquid meets the surface varies more than with a smooth surface, and so gas is more likely to be trapped where the contact angle is decreased, i.e., where the distal part of projections on the surface meet the liquid before the proximal part of the projection, leaving a corner of gas at the upstream proximal part of the projection.

Secondly, for example, bubbles may form spontaneously because of a change in temperature or energy or other factors. Alternatively or additionally, gas (e.g., air) may be sucked into the system if the pressure of the system falls, e.g. with a fall in temperature. Resists and other chemicals used on the surface of substrates may cause foaming or react with the immersion liquid or radiation, causing a change in temperature or energy, or create gas bubbles chemically.

Thirdly, for example, there may be one or more gutters configured to remove excess immersion liquid from the surface of the substrate table that may also trap gas when the substrate moves relative to the immersion system or radiation system. Furthermore, these gutters may cause too much liquid to be lost, resulting in an overall drop in liquid level.

A way in which gas might not be replaced by liquid is depicted in FIG. 11a. Between a substrate W and a substrate table WT, for instance, there exists a gap that fills with liquid each time the gap passes under the immersion system 12. A gas knife 15 serves to clear the path of contaminants and liquid for the immersion system 12. However, when the liquid-filled gap passes under the gas knife 15, liquid droplets D may spray up onto the surface of the substrate W and the substrate table WT. Depending on the liquidphilic (e.g., hydrophilic) or liquidphobic (e.g., hydrophobic) nature of the substrate W surface, the surface of the droplet D forms a greater or lesser angle with the substrate surface. The liquid front F is also at an angle with the substrate W surface because the substrate W surface is traveling laterally with respect to the liquid front (the arrow indicates the direction of travel of the substrate table WT containing the substrate W). FIG. 10 shows the relative positions of the liquid front F and the droplet D. The meeting angles of the liquid may cause a small amount of gas to be trapped between the relatively moving liquid front F and droplet D surface, thus causing a gas bubble B in the immersion liquid.

Bubbles might be formed between the substrate table and the substrate, on or around sensors or on or around a closing plate used to seal the immersion system between scans of substrates. The bubbles might then detach from the surfaces and float in the immersion liquid, or even float up to the final optical element of the projection system, possibly affecting the quality of the projected image.

SUMMARY

It is desirable, for example, to reduce the presence of bubbles in parts of the immersion liquid through which the projection beam will pass.

According to an aspect of the invention, there is provided a lithographic projection apparatus arranged to project a radiation beam, through a liquid, onto a substrate, the apparatus comprising a support table configured to hold an object, the object comprising (i) a sensor, or (ii) a substrate, or (iii) a closing plate, or (iv) a cover plate or (v) any combination of (i)-(iv), wherein a gap between the object and the support table is kept to a minimum in order to minimize bubble formation in the liquid.

There may also be provided an actuator configured to move the object laterally in a hole in the support table in order to reduce, when in contact with the liquid, a gap between an edge of the object and a side of the hole.

According to an aspect of the invention, there is provided a lithographic apparatus arranged to project a radiation beam, through a liquid, onto a substrate, the apparatus comprising a support table configured to hold the substrate and having a plurality of objects share a hole in the support table so as to have a common gap between them and the hole and reduce a gap area on the support table.

According to an aspect of the invention, there is provided a lithographic projection apparatus arranged to project a radiation beam, through a liquid, onto a substrate, the apparatus comprising a support table configured to hold an object, the object having a slanted surface and the support table having a hole, in which the object is to be positioned, with a corresponding slanted surface to allow self-centering of the object in the hole.

There may also be provided a cover plate to cover the object, the cover plate being segmented such that the segments are configured to slide over each other and cover a gap between the object and the support table.

The cover plate may be made of elastic material such that it is configured to stretch over the object and cover a gap between the object and the support table. The cover plate may be a sticker configured to cover the gap, the sticker being made of glass, metal, plastic or other suitable unreactive substance and may be adhered to the support table and the object using a thin film of liquid (e.g., water) or the suction of a low pressure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
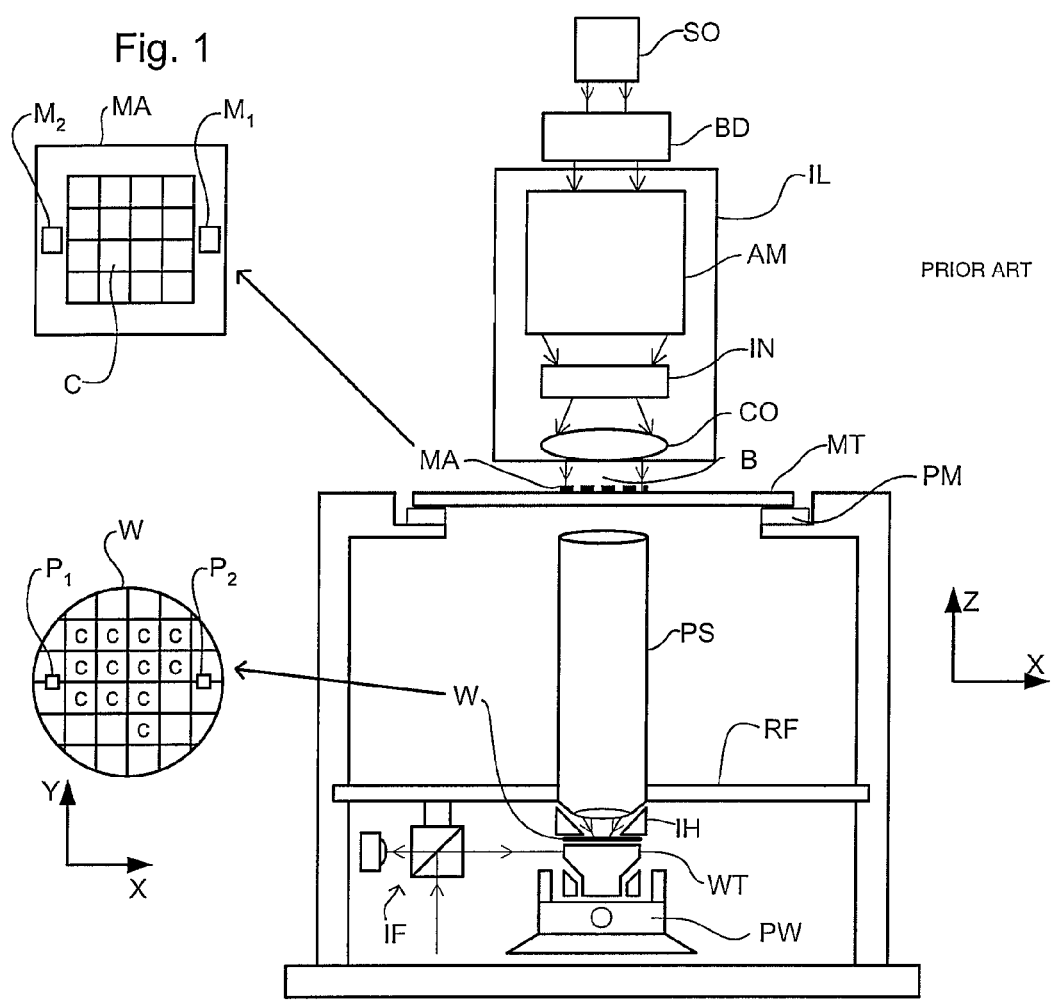
FIG. 1 depicts a lithographic apparatus according to an embodiment of the invention.
Figure 2:
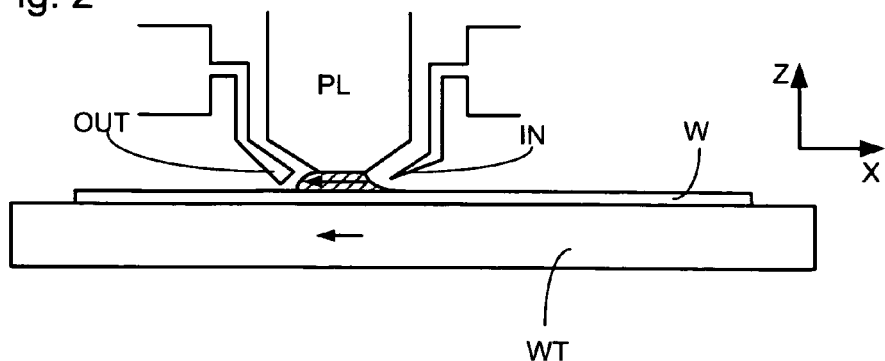
FIGS. 2 and 3 depict a liquid supply system for use in a lithographic projection apparatus.
Figure 3:
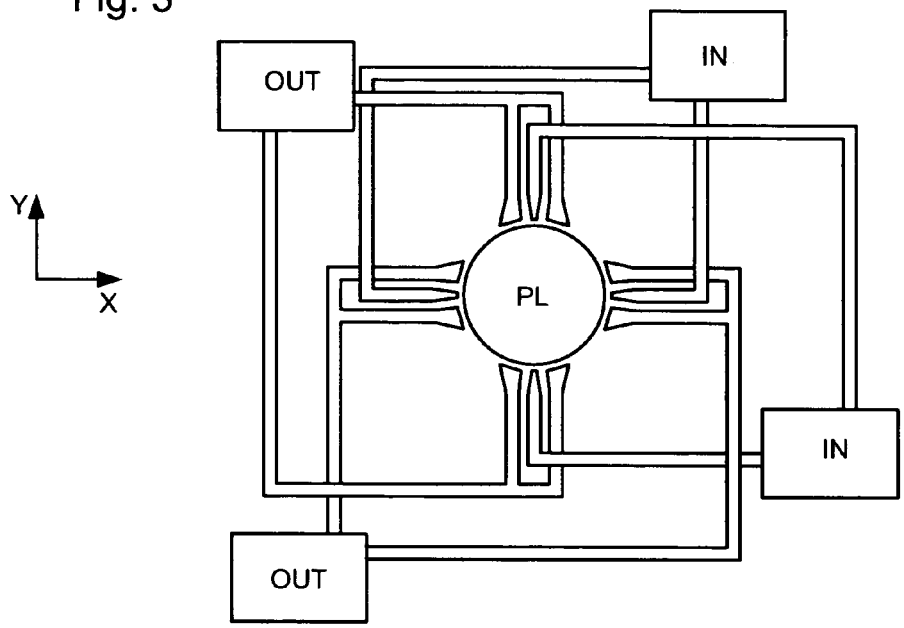
Figure 4:
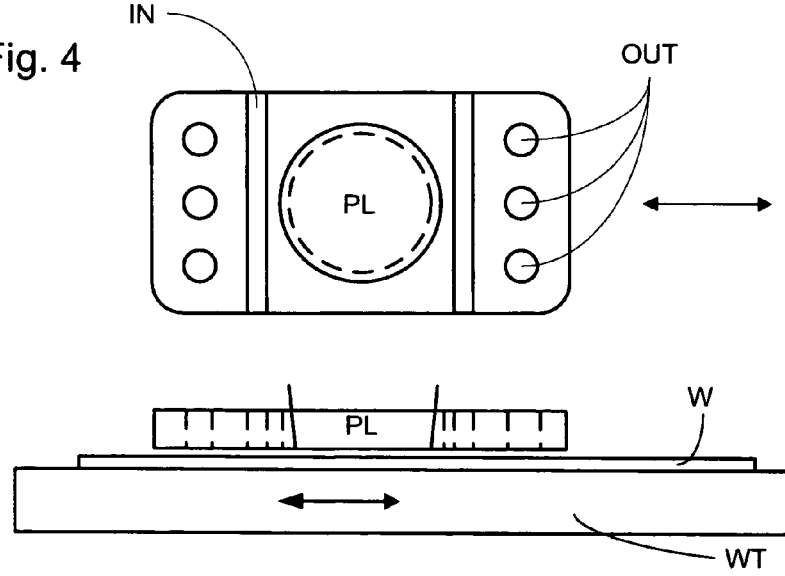
FIG. 4 depicts another liquid supply system for use in a lithographic projection apparatus.
Figure 5:
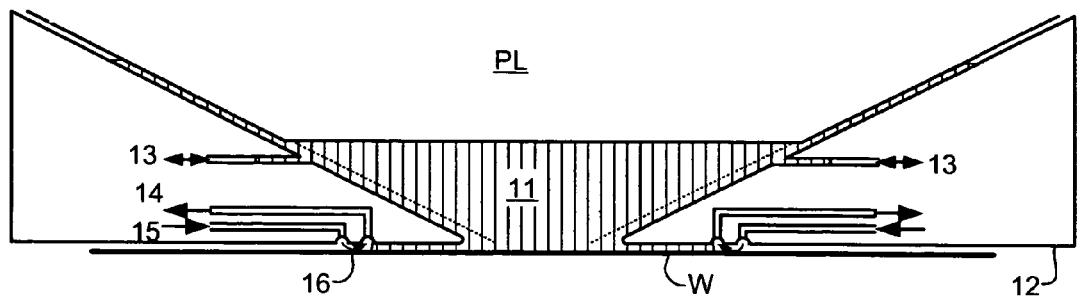
FIG. 5 depicts an immersion system according to an embodiment of the invention.
Figure 6:
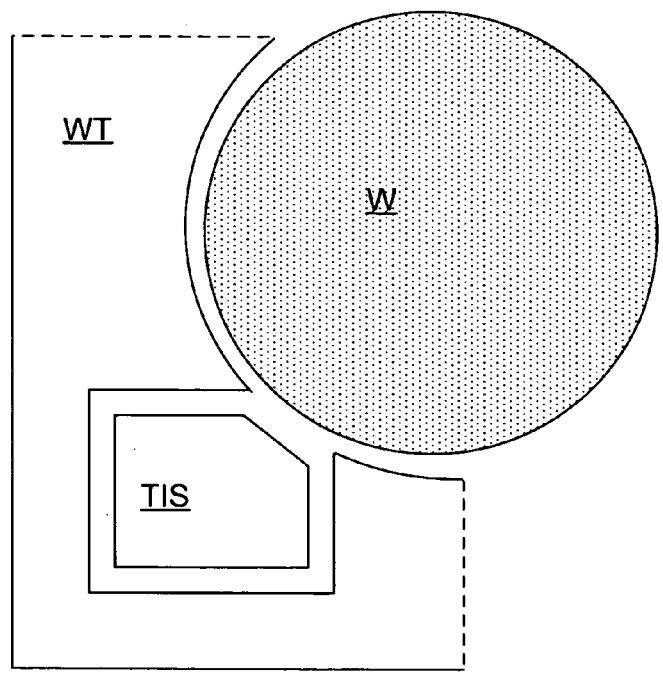
FIG. 6 depicts a plan view of a substrate table according to an embodiment of the present invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

One way to deal with bubble formation in the immersion liquid is to prevent the formation of bubbles in the first place. This can be done by smoothing surfaces and reducing areas in which gas bubbles can be trapped when the space is immersed in liquid.

One way of doing this is to avoid or reduce gaps in the substrate table. Gaps exist between objects that sit in holes in the substrate table and the sides of the holes. Objects which may be placed in or on the substrate table include the substrate, one or more sensors and one or more cover plates for the sensor(s) and/or the substrate. The reason for the gaps is that the substrate and the sensors need to be or should be removable as well as easily replaced. Therefore, there are certain tolerances that are used in order for an object in or on a substrate table to be easily removed and/or exchanged. This tolerance may be of the order of 0.5 mm. However, in an embodiment to reduce bubble formation, the gap is reduced to 0.1 mm and/or the number of gaps is reduced.

One way to reduce the gap size is to use a cover plate. A cover plate may be sized so that it covers not only the object it is intended to cover, but also any gap around the object. A cover plate should have a maximum thickness no greater than a height step that the lithographic apparatus is able to accommodate.

A single cover plate may be used to cover several objects such as the substrate as well as one or more surrounding sensors. A gap between the sensor and a substrate is thereby covered by the cover plate. A cover plate may be integral with the object that it is intended to cover so that as the object is dropped into a hole in the substrate table, the cover plate automatically covers not only the object but also the surrounding hole, thereby covering up any gap. Depending on the object, the cover plate may be transparent to radiation and may be made of quartz, for instance. The cover plate may be transparent to the radiation beam without being integral with a sensor. It may, for example, be a pellicle that covers all or a portion of substrate table but is microns thick and therefore transparent to the radiation. The pellicle may be attached to the outside of the substrate table.

Figure 8:
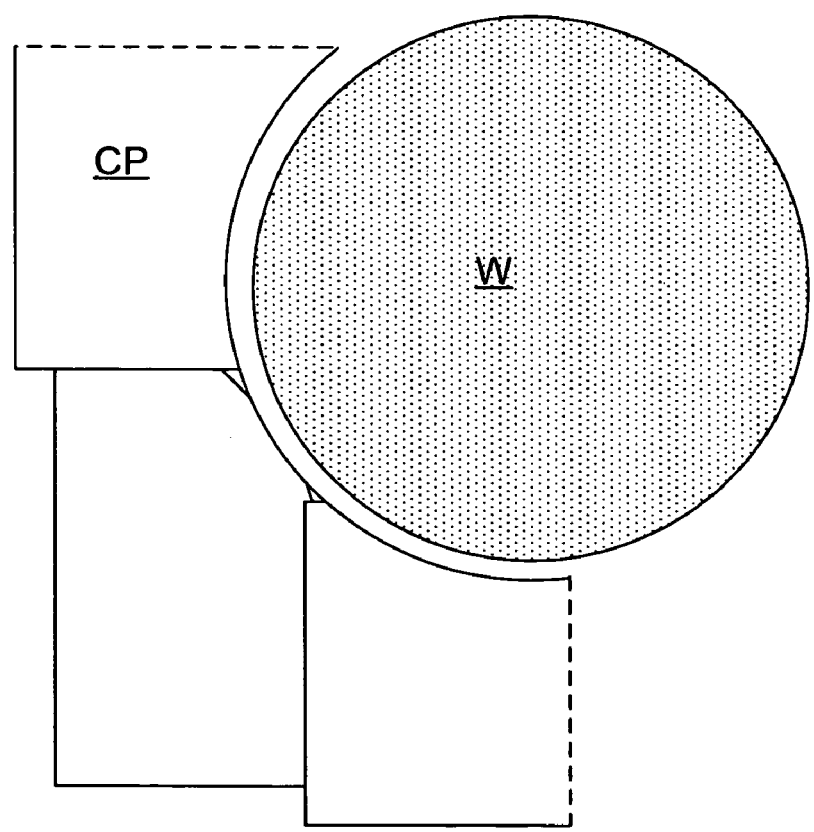
FIG. 8 depicts a plan view of a substrate and a cover plate according to an embodiment of the invention.

The cover plate may be made in different ways. A segmented cover plate as shown in FIG. 8 may have several portions which slide relative to each other, thereby changing shape and size and being adaptable to cover the shapes and sizes of gaps on different substrate tables. In this case, the sides of the segmented plate have narrow tolerances. They are polished to ensure that the gaps between the segments are narrow and the contact between them is smooth. The immersion liquid offers a self-lubricating system for the segments, though stagnant liquid pockets in a gap between segments may be avoided by extraction of the liquid from underneath the cover e.g. using a vacuum.

Alternatively, the cover plate may be flexible or stretchable. The cover plate may then be fixed over the object it is intended to cover and any surrounding gap. Alternatively or additionally, the cover plate may be supplied with a stretchable hole through which an object may be inserted into a hole in the substrate table. The stretchable hole will return to its original shape once the object is inserted, effectively closing the hole in the cover plate. FIG. 8 shows three segments of the cover plate CP around the edges of a substrate W. The different segments may each be covering a sensor on the substrate table.

The segmented cover plate should work well if there is no gap between the segments. This can be facilitated, for example, by using a tenon and groove system. It should be noted that a T-shaped gap may create more bubbles than a simple U-shaped gap and so the segments of the segmented cover plate should be carefully linked together to avoid aggravating bubble creation in the immersion system.

Figure 9A:
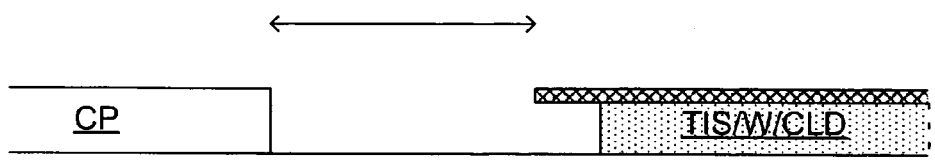
FIGS. 9a and 9b depict a side view of a cover plate and an object according to an embodiment of the invention.
Figure 9B:
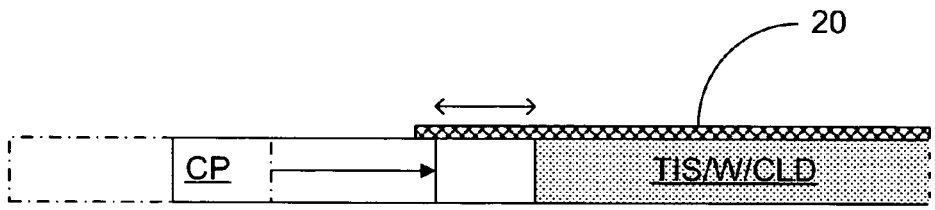

Alternatively or additionally, the cover plate or substrate or even a sensor may be moved during the course of projection onto the substrate. Dynamic minimization of a gap is shown in FIGS. 9a and 9b and may be dependent on the location of the immersion space and projection system with respect to the substrate. The cover plate CP of the substrate W (or the sensor TIS) may be moved using an actuator in conjunction with a timetable or using a sensor indicating where the immersion space is relative to the substrate table. The gaps need only to be minimized at the time the immersion space is above that part of the substrate table. A gas knife clears the surface of the substrate table of liquid between exposures to immersion liquid, and thereby contributes to the risk of gas bubbles when the surface is re-immersed. Because the gas knife dries the entire surface of the substrate table, the gaps cannot be pre-filled with liquid before coming into contact with the immersion space.

Alternatively, to minimize the number of gaps, a sensor TIS and/or the substrate W may share a hole in the substrate table WT.

Figure 7:
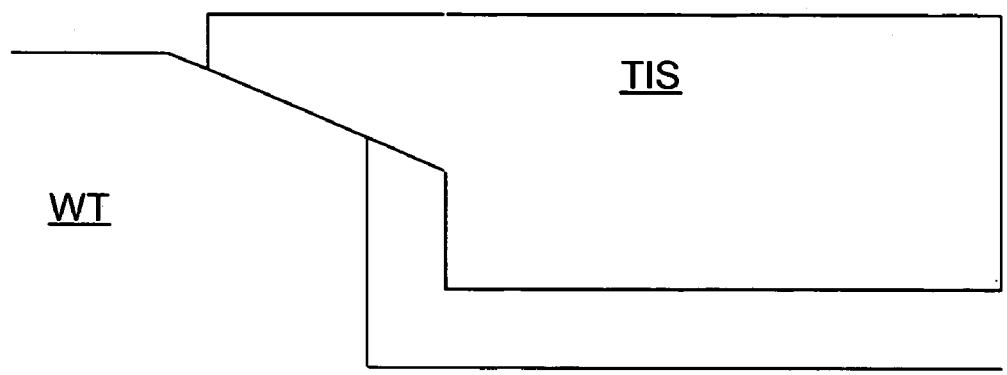
FIG. 7 depicts a side view of a substrate table according to an embodiment of the invention.

One way to minimize the size of the gap required for the placement of an object in or on the substrate table is to have the sensor TIS (or the substrate W or any other object in or on the substrate table) shaped with a slanted (e.g., conical) edge that matches a slanted (e.g., conical) surface of the hole in the substrate table WT. This is shown in FIG. 7. Less of a gap is required because the sensor TIS is effectively self-centering. This provides less surface area and less of a trap for bubbles. Using a self-centering sensor may give rise to a height step rather than a gap. The lithographic apparatus would then be adapted to be able to take a height step into account during a scan of the substrate table.

An alternative method is also to use a membrane as part of a cover plate that bridges the gap between a substrate table and a substrate or a sensor or any other object in or on the substrate table. This membrane may comprise a sticker. The sticker may be any suitable thickness as long as it fits between the substrate table and the projection system, e.g., 5 to 50 microns.

One example of the use of a sticker is with a closing plate. The groove around a closing plate that is used between substrate swaps is prone to containing bubbles because the closing plate is lowered onto the substrate table once the substrate has been replaced and then placed under the immersion system to keep the immersion liquid sealed. Movement of walls of the immersion system in this way is a prominent reason for bubble formation. Therefore, the top surface of the closing plate CLD may be extended as shown in FIG. 9b with a projection so that the upper surface 20 covers any groove around the part of the closing plate that actually sits within the substrate table. Because the hole in the substrate table is sealed by the extended upper surface of the closing plate, the closing plate may be held in the substrate table using a vacuum, and so the problem of bubbles is reduced or eliminated. In an embodiment, the extended surface 20 may be a thin circular layer that is made from a solid piece of glass made by etching, or a sticker on the closing plate. The sticker may be 10 to 20 μm so that the height step does not cause a problem for the immersion system. The closing plate can then be released by applying a pulse of pressurized gas under the extended surface.

The sticker may be used to cover a gap between the substrate and the cover plate. It may be made of glass, metal or plastic or any other suitable unreactive substance. The sticker may be fixed with adhesive, a thin film of liquid, or suction caused by a vacuum. Alternatively, it may be an integral part of the substrate or the cover plate (or the sensor or closing plate).

Figure 10:
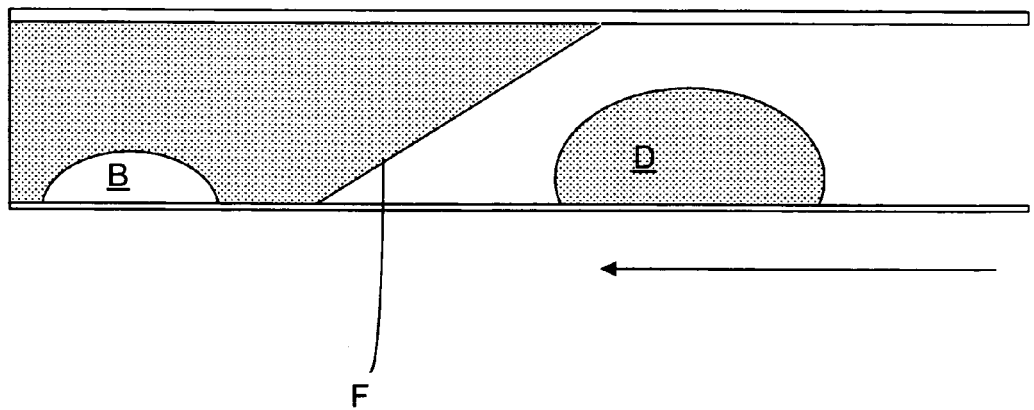
FIG. 10 depicts a side view of a bubble being formed on the surface of the substrate.

Turning to FIG. 10, the problem of droplets D of liquid on the surface of the substrate causing gas bubbles is shown (and described earlier). There are several ways to deal with the droplets D on the substrate.

One method is to have substrate table moving more slowly with respect to the immersion system so that the liquid front F is at less of an angle with respect to the substrate W and there is less space for gas to be trapped between the droplet D and the liquid front F.

Alternatively or additionally, the shape of the droplet D may be changed so that the angle between the droplet D and the substrate W is less acute so that less gas is trapped between the two liquid surfaces D and F. One way to do this is to make the surface of the substrate more liquidphilic so that the surface of the droplet D is closer to perpendicular or even at an obtuse angle to the substrate, rather than at an acute angle wherein gas may be trapped.

Figure 11A:
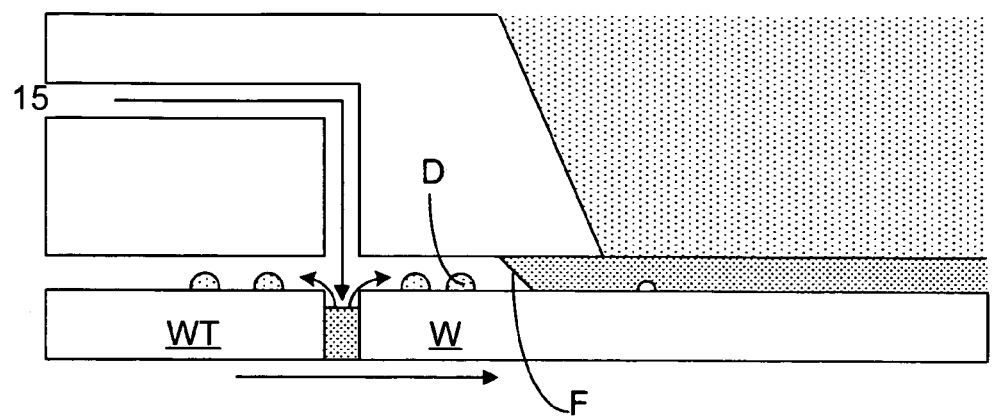
FIGS. 11a and 11b depict an immersion system according to an embodiment of the invention.

As mentioned above, liquid droplets D may be created on the substrate surface from the gas knife directing the gas into a gap between the substrate and the substrate table, thus causing liquid to "splash out" onto the substrate surface and the substrate table surface as shown in FIG. 11a. In an embodiment, the gas knife may precede the liquid front in a scan of the substrate surface and so liquid droplets may be created just before the liquid front of the immersion system reaches the same point on a substrate surface. This is shown by the direction of the arrow in FIG. 11a.

Figure 11B:
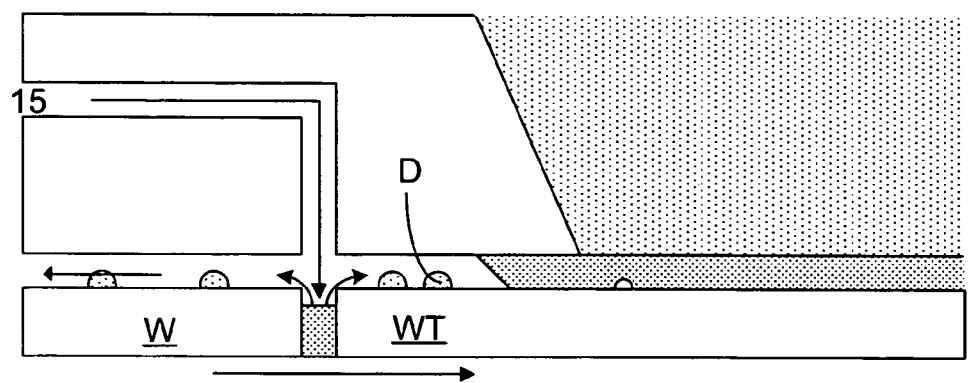

One way to overcome this problem is shown in FIG. 11b and is to scan towards the central part of the substrate rather than towards the edge. In FIG. 11b, the substrate W and the substrate table WT are reversed in position so that the scanning occurs from the edge of the substrate W toward its central part. Because of the direction of movement of substrate with respect to the gas knife, as the edge of substrate passes under the gas knife, the droplets that do spray onto the surface of the substrate are pushed forward by the gas knife. Those droplets D are not, in this embodiment, blown into the path of the liquid front F, but they are effectively blown ahead of the liquid front F by the gas knife as shown by the arrow overlapping the droplets D in FIG. 11b.

Bubbles may mostly occur on or near the dies nearest the edge of the substrate. The above-described adaptation to the scanning direction may be further improved by first exposing all inner dies of the substrate W. The outer dies are subsequently exposed. In this way, by choosing a "long" exposure routing for exposing the edge dies, bubbles created by going back and forth over the substrate edge are given maximum time to escape before exposure. This method may be useful for reducing the number of bubbles that occur at the edge of a substrate.

Another possible solution to the problem of spraying liquid droplets from a gap between the substrate and the substrate table is to ensure that no liquid is left in the gap, for example by ensuring the drain flow is efficient. However, this runs the risk of gas being trapped in the gap and floating up into the immersion system as described earlier. Refilling of the gap may be required between the gas knife and the liquid front.

Minimizing the distance between the liquid front and the gas knife in the immersion system may still cause bubbles to be created, but only over a short distance near the very edge of the substrate, thus possibly reducing errors on a greater part of the substrate.

By reference to a sensor herein, it is understood that this may include a transmission image sensor (TIS), a spot sensor, an integrated lens interferometer sensor (ILIAS), and/or a slit sensor and may include a sensor that comprises more than one detector. For example, a TIS may include eight detectors, which may be covered by a cover plate either all together or individually. These sensors may be used to measure image location, radiation dose, aberrations, polarization, and/or other image quality parameters as well as or alternatively to align the substrate.

In these ways, errors caused by bubbles such as minimum dose errors and distortions or blank spots on the exposed substrate may be reduced.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a radiation beam through a liquid onto a substrate, the apparatus comprising a support table configured to hold an object, the object comprising (i) a sensor, or (ii) a substrate, or (iii) a closing plate, or (iv) any combination of (i)-(iii), and a cover plate to cover a gap between the object and the support table, at least part of the cover plate being transparent to the radiation beam and the cover plate being adhered, in use of the apparatus, to the support table and releasably detachable from the support table, wherein the cover plate comprises a sticker configured to cover the gap, the sticker being adhered in use of the apparatus to, or an integral part of, the support table, the object, or both the support table and the object on either side of the gap.

2. The apparatus of claim 1, wherein the gap between the object and the support table is less than 0.8 mm.

3. The apparatus of claim 1, wherein the gap between the object and the support table is less than 0.3 mm.

4. The apparatus of claim 1, comprising a single cover plate used to cover a plurality of sensors in or on the support table.

5. The apparatus of claim 1, wherein the cover plate is a pellicle.

6. The apparatus of claim 5, wherein the pellicle is connected on an outer edge of the support table.

7. The apparatus of claim 4, wherein the cover plate is integrated with a sensor.

8. The apparatus of claim 4, wherein the cover plate is made of quartz.

9. The apparatus of claim 1, wherein the support table comprises a hole configured to hold at least two objects therein so as to have a common gap between the objects and an edge of the hole, thus reducing a total gap area on the support table.

10. The apparatus of claim 1, wherein the object comprises a slanted surface and the support table comprises a hole, in which the object is to be positioned, with a corresponding slanted surface to allow self-centering of the object in the hole.

11. The apparatus of claim 10, wherein the slanted edge is a conical surface and the hole is a conical hole.

12. The apparatus of claim 1, wherein the cover plate is segmented such that the segments are configured to slide over each other and cover the gap between the object and the support table.

13. A lithographic projection apparatus arranged to project a radiation beam through a liquid onto a substrate, the apparatus comprising:
    a support table configured to hold an object; and
    a cover plate to cover the object, the cover plate being made of elastic material such that it is configured to stretch over the object and cover a gap between the object and the support table.

14. The apparatus of claim 13, wherein the cover plate comprises a hole that is stretchable and through which the object may be inserted into a hole in the support table.

15. The apparatus of claim 1, wherein the sticker is made of a thin layer of glass, metal, plastic, or any other suitable unreactive substance.

* * * * *